(12) United States Patent
Chan et al.

(10) Patent No.: US 8,624,389 B2
(45) Date of Patent: Jan. 7, 2014

(54) LIGHT EMITTING DIODE MODULE

(75) Inventors: Shiun-Wei Chan, Hsinchu (TW);
Chih-Hsun Ke, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 259 days.

(21) Appl. No.: 13/162,581

(22) Filed: Jun. 17, 2011

(65) Prior Publication Data

US 2012/0080696 A1 Apr. 5, 2012

(30) Foreign Application Priority Data

Sep. 30, 2010 (CN) .......................... 2010 1 0297709

(51) Int. Cl.
*H01L 23/04* (2006.01)
(52) U.S. Cl.
USPC .......................................... 257/712; 257/713

(58) Field of Classification Search
USPC ................................................ 257/712, 713
See application file for complete search history.

(56) References Cited

U.S. PATENT DOCUMENTS

| 4,255,749 | A | * | 3/1981 | Henry ............................ 713/500 |
| 5,035,063 | A | * | 7/1991 | Wang ............................ 33/561.1 |
| 5,785,418 | A | * | 7/1998 | Hochstein ...................... 362/373 |
| 7,064,429 | B2 | * | 6/2006 | Bemmerl et al. .............. 257/713 |
| 7,572,027 | B2 | * | 8/2009 | Zampini et al. ............... 362/225 |
| 2009/0310354 | A1 | * | 12/2009 | Zampini et al. ............... 362/235 |
| 2011/0068709 | A1 | * | 3/2011 | Ing et al. ....................... 315/294 |

* cited by examiner

*Primary Examiner* — Howard Weiss
*Assistant Examiner* — Steven Rao
(74) *Attorney, Agent, or Firm* — Altis Law Group, Inc.

(57) ABSTRACT

An LED module includes a plurality of lighting sources each including a substrate, a first and second lead frames arranged on the substrate, an LED chip electrically connected to the first and the second lead frames, and an encapsulation covering the LED chip. The first lead frame of each of the lighting sources connects with the second lead frame of an adjacent lighting source electrically and mechanically.

9 Claims, 10 Drawing Sheets

LIGHT EMITTING DIODE MODULE

BACKGROUND

1. Technical Field

The disclosure relates to light emitting diodes, and particularly to a light emitting diode module.

2. Description of the Related Art

Light emitting diodes' (LEDs') many advantages, such as high luminosity, low operational voltage, low power consumption, compatibility with integrated circuits, easy driving, long term reliability, and environmental friendliness have promoted their wide use as a light source. Now, light emitting diodes are commonly applied in environmental lighting.

Commonly used LED modules have a plurality of LEDs arranged on the circuit board. However, the LEDs are soldered on the circuit board. Therefore, the position of the LEDs cannot be altered. When the position of the LEDs must be changed for specific needs, the user must redesign the layout of the circuit board.

Therefore, it is desirable to provide an LED module which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present LED module. Moreover, in the drawings, like reference numerals designate corresponding parts throughout the views.

DETAILED DESCRIPTION

Embodiments of an LED module as disclosed are described in detail here with reference to the drawings.

Figure 1:
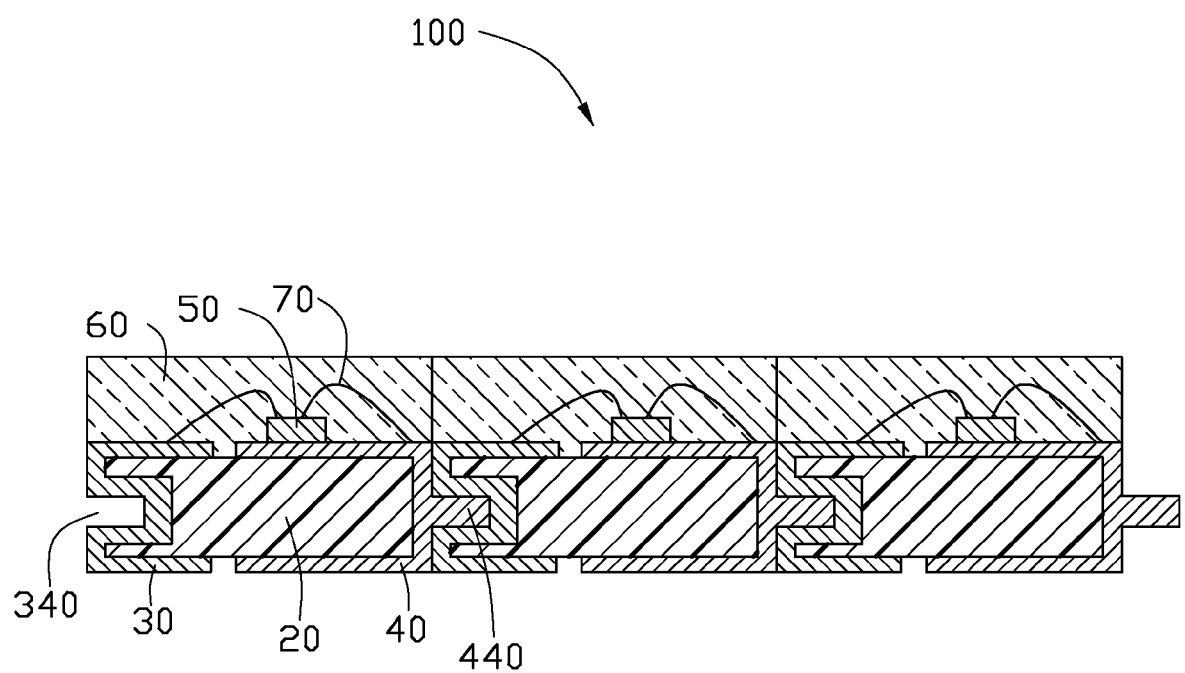
FIG. 1 is a cross section view of a light emitting diode module in accordance with a first embodiment.
Figure 2:
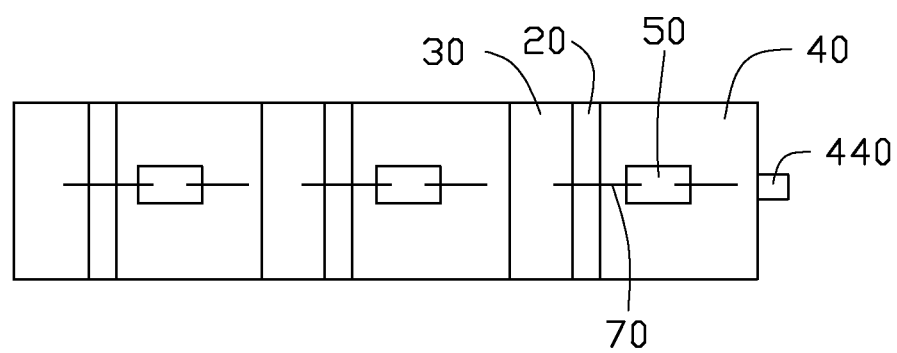
FIG. 2 is a top view of the LED module of FIG. 1.
Figure 3:
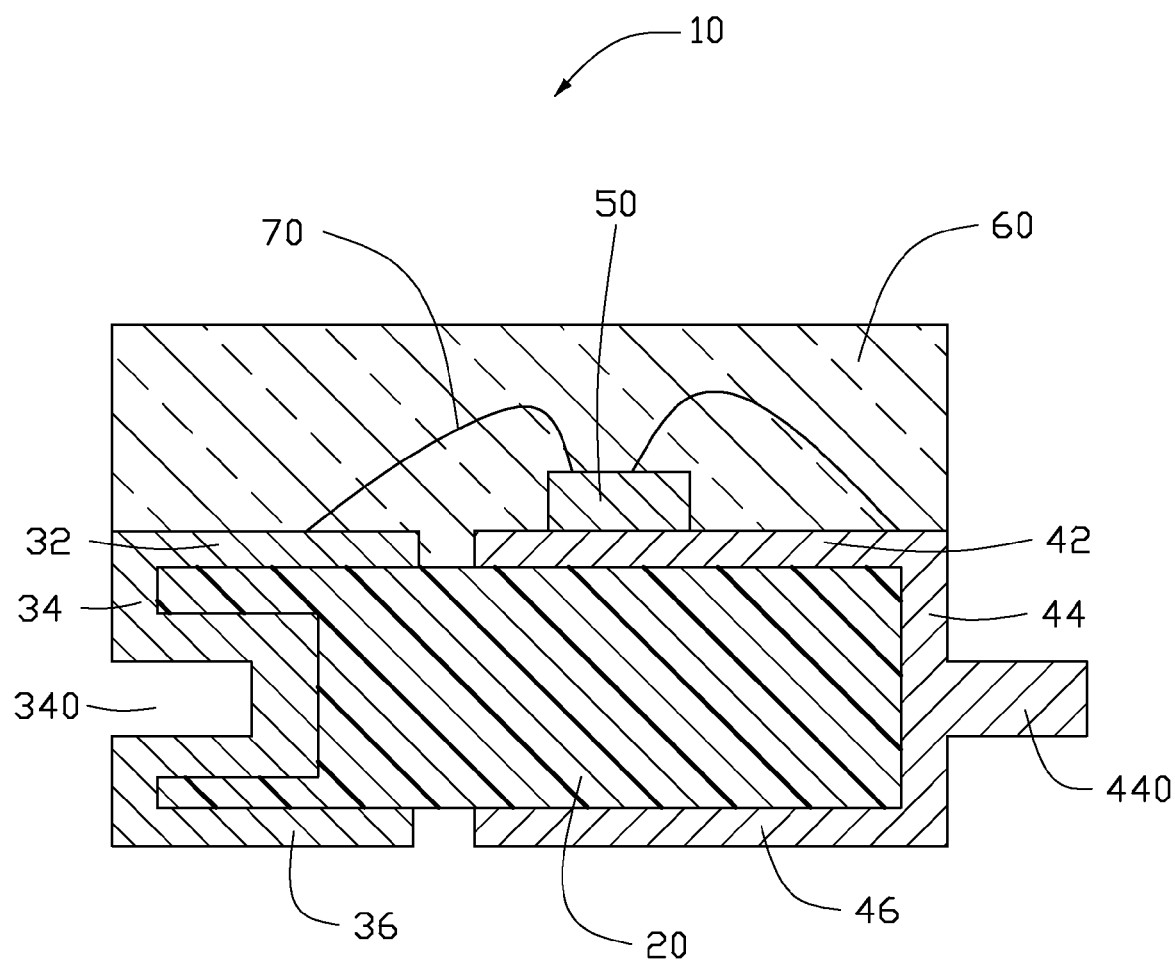
FIG. 3 is a schematic view of a light source unit of the LED module of FIG. 1.

Referring to FIGS. 1-3, an LED module 100 includes a plurality of light sources 10. Each light source 10 includes a substrate 20, a first lead frame 30, a second lead frame 40 attached on the substrate 20, an LED chip 50 attached on the second lead frame 40, and an encapsulation 60 covering the LED chip 50. The substrate 20 is made of plastic or ceramic materials. In some embodiments, the substrate 20 can be made of ceramics having high thermal dissipation coefficient. The substrate 20 having a cavity (not shown) defined in a center of a left side is rectangle. The first lead frame 30 can be embedded into the cavity. The first lead frame 30 and the second lead frame 40 each are formed into one piece with metal. The first lead frame 30 and the second lead frame 40 are tightly attached on a surface of the substrate 20. The first lead frame 30 includes a wire portion 32, a fastening portion 36, and a connection portion 34 connecting to the wire portion 32 and the fastening portion 36. The wire portion 32 is substantially parallel to the fastening portion 36 and substantially perpendicular to the connection portion 34.

The wire portion 32 located on a top surface of the substrate 20 connects to an electrode of the LED chip 50. The fastening portion 36 arranged on a bottom of the substrate 20 fastens the first lead frame 30 to the substrate 20. The connection portion 34 arranged on the left side of the substrate 20 is bent towards the cavity of the substrate 20 and forms a rectangular mortise 340.

The second lead frame 40 surrounding a right side of the substrate 20 includes a wire portion 42, a fastening portion 46, and a connection portion 44 connected to the wire portion 42 and the fastening portion 46. The wire portion 42 of the second lead frames 40 is arranged on the top surface of the substrate 20 and is electrically insulated from the wire portion 32 of the first lead frame 30. The wire portion 42 of the second lead frames 40 attaches the LED chip 50 and connects the other electrode (not shown) of the LED chip 50.

The fastening portion 46 of the second lead frame 40 is arranged on the bottom of the substrate 20 and is electrically insulated from the fastening portion 36 of the first lead frame 30. The fastening portion 46 of the second lead frame 40 fastens the second lead frame 40 on the substrate 20. The connection portion 44 of the second lead frame 40 arranged on the right side of the substrate 20 extends outward substantially parallel to form a tenon 440.

The size of the tenon 440 is corresponding to the size of the mortise 340 of the first lead frame 30. Thus, the tenon 440 is securely fastened into the adjacent mortise 340 when two light sources 10 are assembled together, whereby the first lead frame 30 and the second lead frame 40 of the two light sources 10 are mechanically and electrically connected together. The LED chip 50 is made of the III-compound semiconductor, such as GaN or GaInN. The LED chip 50 is fixed on a top surface of the wire portion 42 of the second lead frame 40 by glue. The two electrodes of the LED chip 50 respectively connect to the first lead frame 30 and the second lead frame 40 by two gold wires 70. The encapsulation 60 is made of glass, polycarbonate, or PMMA. The encapsulation 60 is securely fixed on the top surface of the substrate 20 and covers the wire portions 32, 42 of the first lead frame 30 and the second lead frame 40, the LED chip 50, and two gold wires 70. The encapsulation 60 is rectangle in this embodiment, and a profile of the encapsulation 60 is corresponding to that of the top surface of the substrate 20.

The tenon 440 of the second lead frame 40 of each light source 10 is embedded into the mortise 340 of the first lead frame 30 of the adjacent light source 10. The connection portion 44 of the second lead frame 40 of each light source 10 connects to the connection portion 34 of the first lead frame 30 of the adjacent light source 10. One side surface of the encapsulation 60 of each light source 10 connects to one side surface of the encapsulation 60 of the adjacent light source 10. Thus, each of the light sources 10 connects in series and forms the LED module 100.

Because two adjacent ones of the light sources 10 connect together by the first lead frame 30 and the second lead frame 40, the light emitting diode module 100 does not need the circuit board. The LED module 100 in this embodiment is not limited to the layout of the circuit board. The LED module 100 in this embodiment reduces the manufacturing cost.

Figure 4:
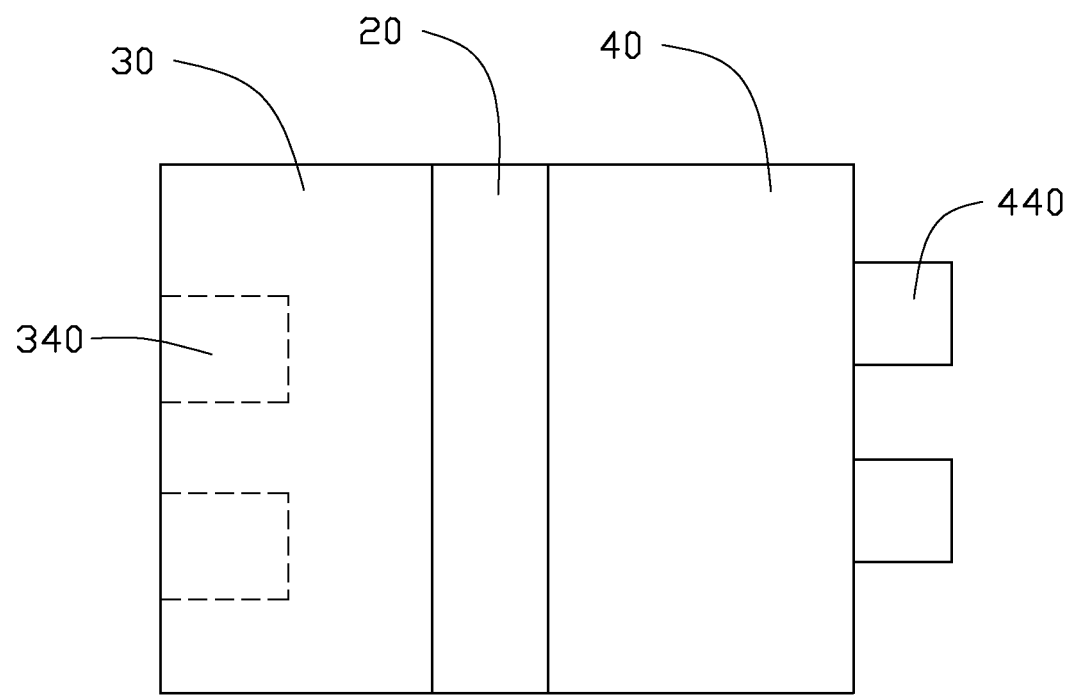
FIG. 4 is a bottom view of a light source unit of an LED module in accordance with a second embodiment.
Figure 5:
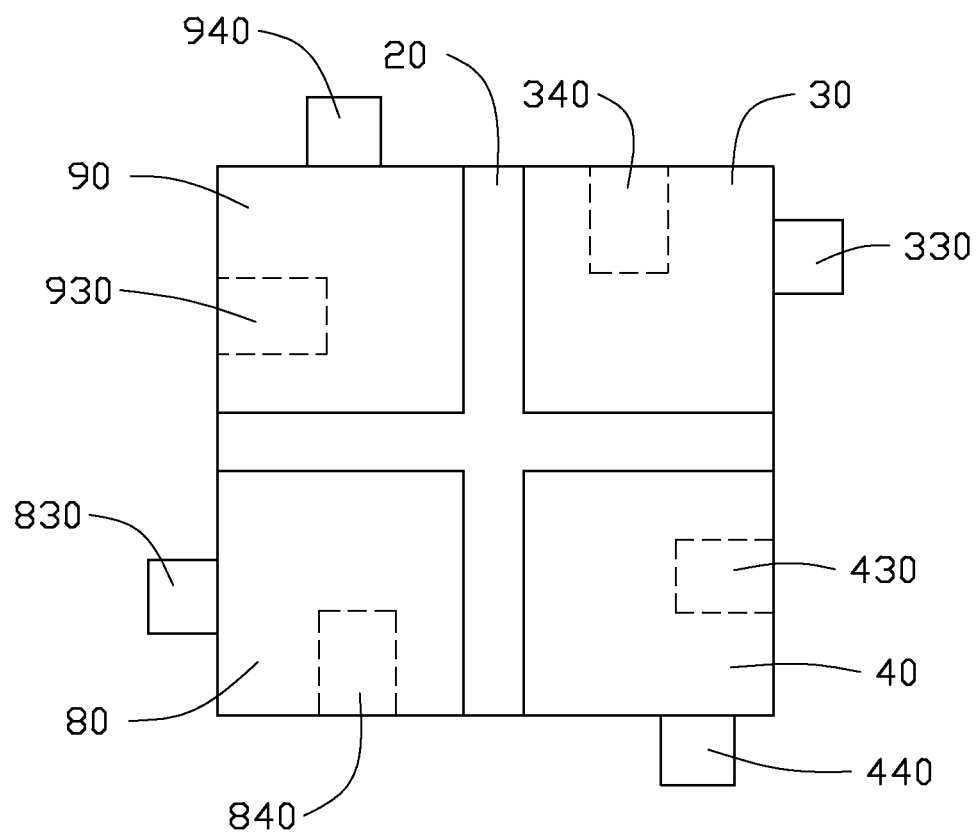
FIG. 5 is a bottom view of a light source unit of an LED module in accordance with a third embodiment.

The tenon 440 and the mortise 340 are not limited to the first embodiment. According to specific needs, quantities of the tenon 440 and the mortise 340 can be altered. Referring to FIG. 4, the light source 10 can tightly fixed the adjacent light source 10 by two tenons 440 and two mortises 340 in a second embodiment. Referring to FIG. 5, the light source 10 includes a first lead frame 30, a second lead frame 40, a third lead frame 80, and a fourth lead frame 90 in a third embodiment. The four lead frames 30, 40, 80, 90 are respectively arranged at four corners of the substrate 20, and electrically insulated mutually, forming a cross-shaped insulation zone.

The polarities of two adjacent lead frames 30, 40, 80, 90 are opposite to each other. Two adjacent lead frames 30, 40, 80, 90 electrically connect to the LED chip 50. Each of the lead frames 30, 40, 80, 90 includes a tenon 330, 440, 830, 940 and a mortise 340, 430, 840, 930. The tenon 330, 440, 830, 940 and the mortise 340, 430, 840, 930 respectively are corresponding to two adjacent outside surfaces of the lead frame 30, 40, 80, 90.

Figure 6:
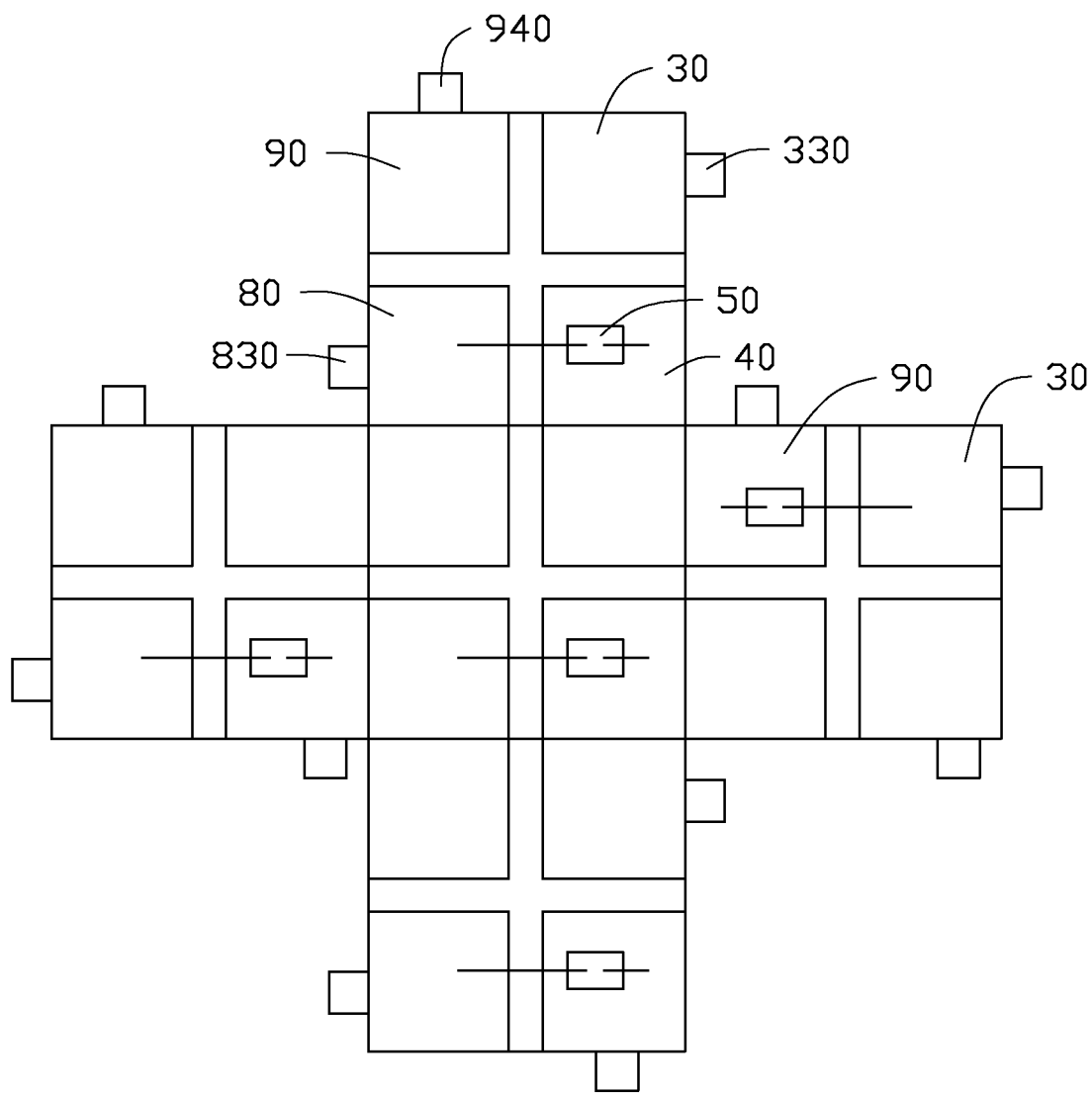
FIG. 6 is a top view of the LED module in accordance with the third embodiment.

The mortises 340, 430, 840, 930 each are respectively arranged between any adjacent two tenons 330, 440, 830, 940 of the four lead frames 30, 40, 80, 90. The tenons 330, 440, 830, 940 each are also respectively arranged between any adjacent two mortises 340, 430, 840, 930. Referring to FIG. 6, each of the light sources 10 connects to the four adjacent light sources 10 by the four lead frames 30, 40, 80, 90. The LED chip 50 of the light source 10 connects to two adjacent lead frames 30, 90 or 40, 80 according to specific needs. Thus, the light sources 50 can be arrayed in a predetermined pattern.

Figure 7:
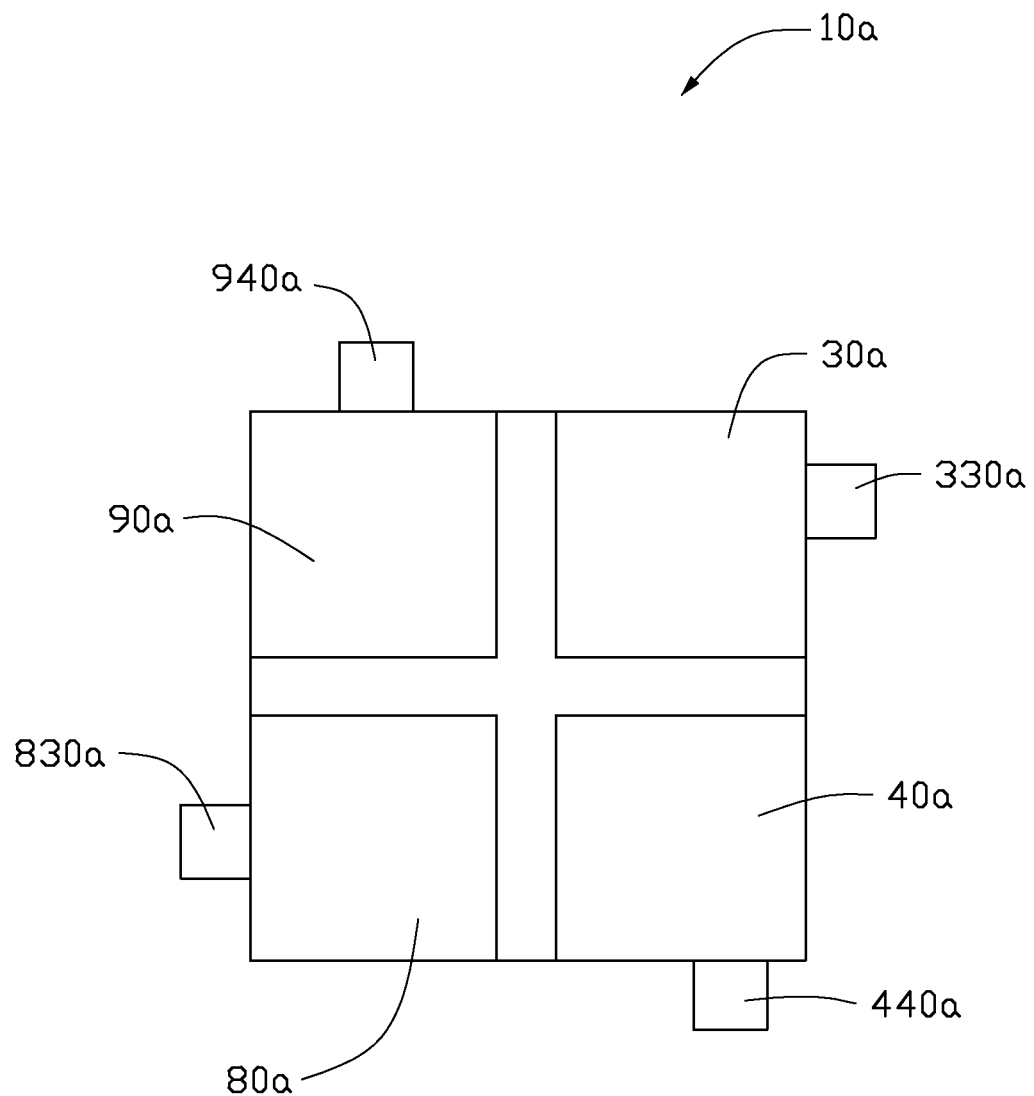
FIG. 7 is a bottom view of a first type light source of an LED module in accordance with a fourth embodiment.
Figure 8:
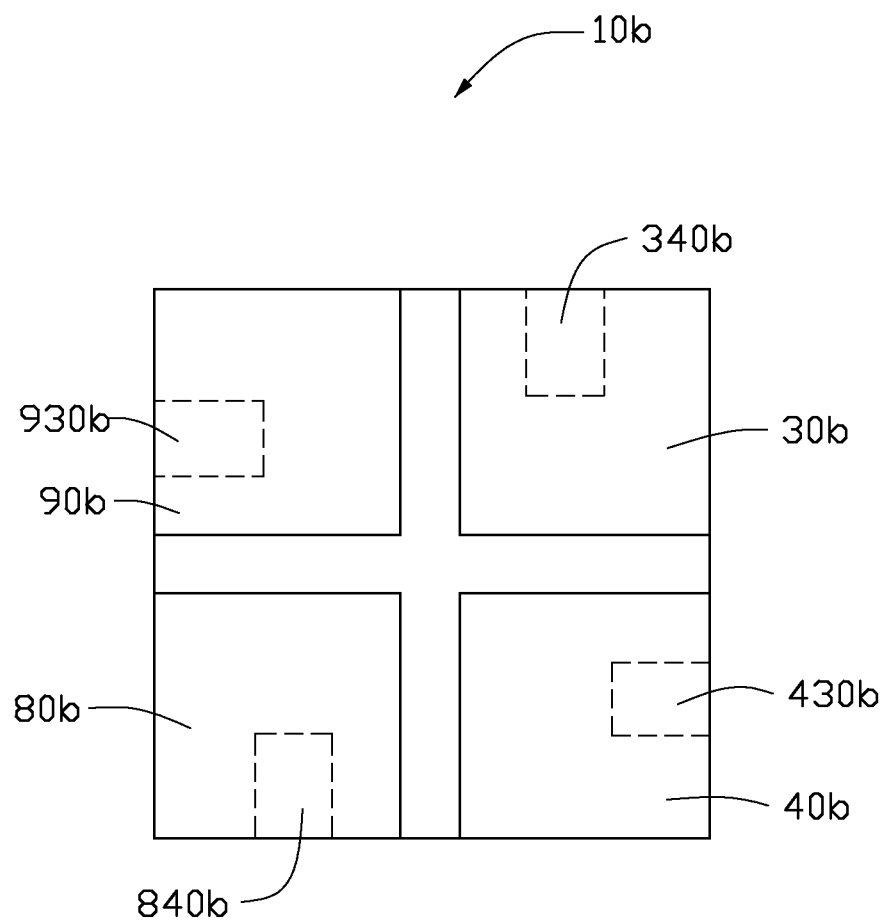
FIG. 8 is a bottom view of a second type light source of the LED module in accordance with the fourth embodiment.

The light sources 10 do not need to have the same structure. Referring to FIGS. 7-8, a first type light source 10a and a second type light source 10b have different structure in a fourth embodiment. Four lead frames 30a, 40a, 80a, 90a of the first type light source 10b only respectively have tenons 330a, 440a, 830a, 940a. Four lead frames 30b, 40b, 80b, 90b of the second type light source 10b only respectively have mortises 340b, 430b, 840b, 930b. The first type light source 10a and the second type light source 10b connect together by the insertion of the adjacent tenons 330a, 440a, 830a, 940a into the adjacent mortises 340b, 430b, 840b, 930b.

Figure 9:
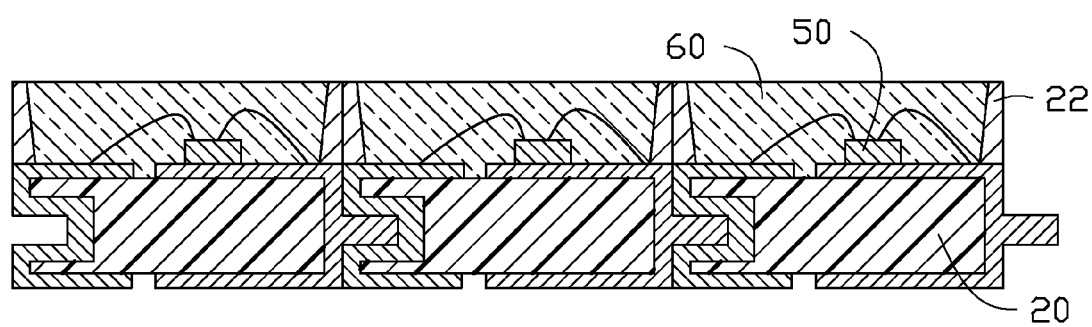
FIG. 9 is a cross section view of an LED module in accordance with a fifth embodiment.

Referring to FIG. 9, the only difference from the above described embodiment is that a ring side wall 22 is formed on the substrate 20 of each of the light emitting sources 20. The ring side wall 22 is around the LED chip 50, and the encapsulation 60 is filled into the space defined by the ring side wall 22 in a fifth embodiment.

Figure 10:
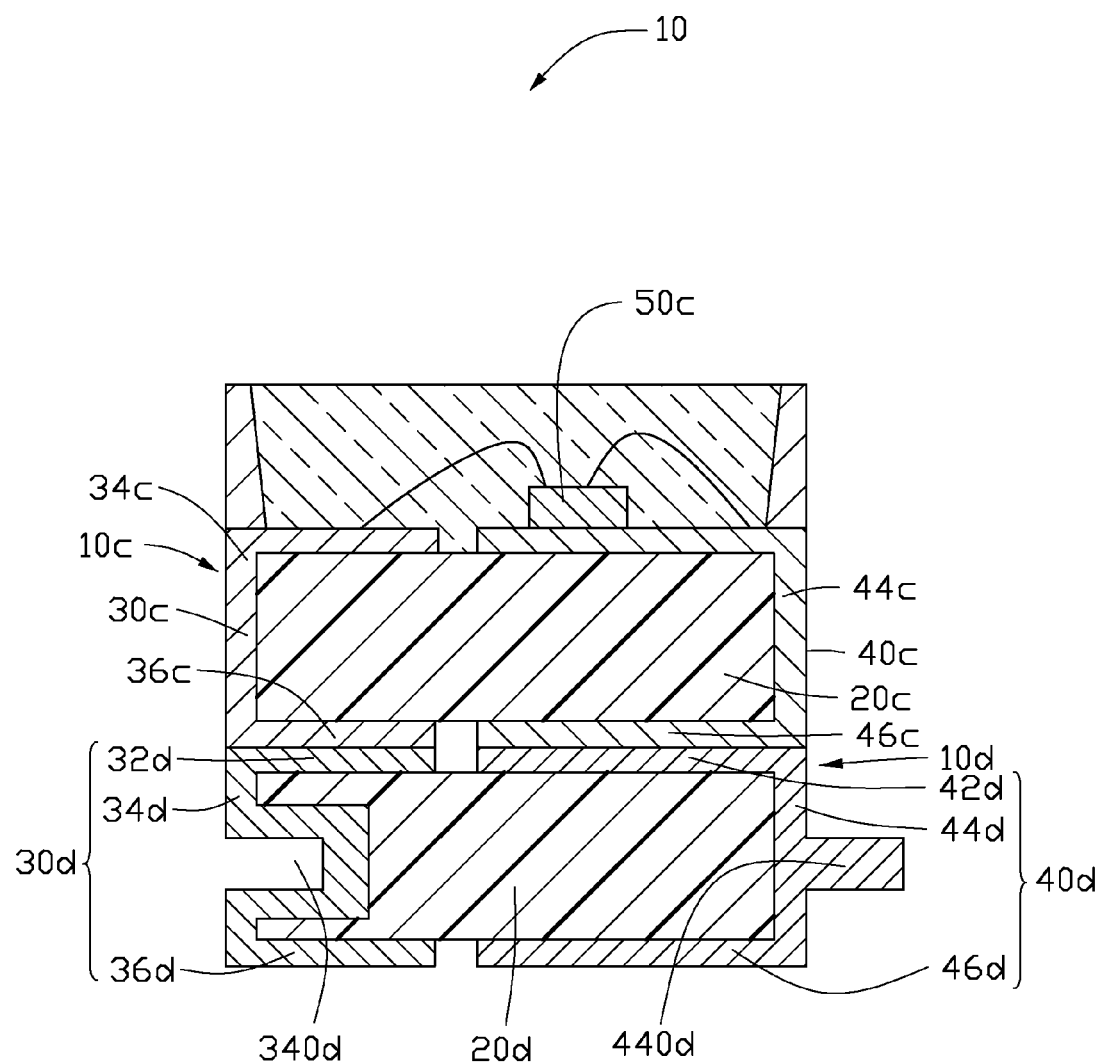
FIG. 10 is a cross section view of a light source of an LED module in accordance with a sixth embodiment.

Referring to FIG. 10, a light source 10 includes an LED 10c and a connection 10d in a sixth embodiment. The only difference in the sixth embodiment from the above embodiment is that a substrate 20c and connection portions 34c and 44c of a first lead frames 30c and a second lead frame 40c do not form a tenon and a mortise. The connection 10d includes a base 20d and a first lead frame 30d and a second lead frame 40d surrounding the base 20d. The first lead frame 30d and the second lead frame 40d of the connection 10d are electrically insulated from each other and surround two opposite sides of the base 20d. A shape of the base 20d is the same with the substrate 20 of the light source 10 of the above described embodiment. A rectangle cavity is also defined on a left side of the base 20d. A structure of the first lead frame 30c of the connection 10d is the same as the first lead frame of the light source 10 of the above described embodiment. A wire portion 32d arranged on a top surface of the base 20d and near the LED chip 50, a fastening portion 36d arranged at a bottom of the base 20d and away the LED chip 50, and a connection portion 34d arranged at a left side of the base 20d are the same as the above described embodiment.

The connection portion 34d of the first lead frame 30d of the connection 10d is bent towards the cavity of the base 20d, and then forms a mortise 340d. The second lead frame 40d of the connection 10d is the same as the second lead frame 40 of the light source 10 of the above described embodiment. A wire portion 42d arranged on the top surface of the base 20d and near the LED chip 50c, a fastening portion 46d arranged at the bottom of the base 20d away from the LED chip 50, and a connection portion 44d arranged at a right side of the base 20d are the same as the above described embodiment.

A tenon 440d is outwardly extended parallel from the connection portion 44d of the second lead frame 40d of the connection 10d. The tenon 10d is used for inserting the mortise 340d of the first lead frame 30d of an adjacent connection 10d. The wire portions 32d, 42d of the first lead frame 30d and the second lead frame 40d of the connection 10d are fixed on the fasten portions 36c, 46c of the first lead frame 30c and the second lead frame 40c of the LED 10c by soldering or other methods.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An LED module, comprising:
a plurality of light sources, each of the light sources including a substrate, a first lead frame and a second lead frame fixed on the substrate, an LED chip electrically connected to the first lead frame and the second lead frame, and an encapsulation covering the LED chip; wherein the second lead frame of one of the light sources directly contacts and connects the first lead frame of an adjacent light source mechanically and electrically, and wherein the second lead frame includes a tenon, the first lead frame includes a mortise, and the tenon of the second lead frame of each of the light sources fastens into the mortise of the first lead frame of the adjacent light source.

2. The LED module of claim 1, wherein each of the first lead frame and the second lead frame includes a wire portion near the LED chip, a fastening portion away the LED chip and a connection portion between the wire portion and the fasten portion, the tenon arranged on the connection portion of the second lead frame, and the mortise arranged on the connection portion of the first lead frame.

3. The LED module of claim 2, wherein the wire portion is parallel to the fastening portion and perpendicular to the connection portion.

4. The LED module of claim 1, wherein the first lead frame and the second lead frame are respectively arranged at two opposite sides of the substrate.

5. The LED module of claim 1, wherein the light source further includes a connection, and the second lead frame and the first lead frame are part of the connection.

6. The LED module of claim 5, wherein the connection includes a base, and the LED chip includes other first lead frame and other second lead frame, and the first lead frame and the second lead frame arranged at two opposite sides of base are respectively fixed to the other first lead frame and the other second lead frame.

7. The LED module of claim 1, further including a third lead frame and a fourth lead frame, wherein the first lead frame, the second lead frame, the third lead frame and the fourth lead frame are insulated mutually and each include a tenon and a mortise.

8. The LED module of claim 7, wherein the tenons and the mortises of the first lead frame, the second lead frame, the third lead frame and the fourth lead frame are alternately distributed.

9. The LED module of claim 7, wherein the LED chip connects any two adjacent lead frames of the first, second, third, and the fourth lead frame.

* * * * *